(12) United States Patent
Manku et al.

(10) Patent No.: US 7,623,000 B2
(45) Date of Patent: Nov. 24, 2009

(54) HYBRID LINEAR AND POLAR MODULATION APPARATUS

(75) Inventors: Tajinder Manku, Waterloo (CA); Abdellatif Bellaouar, Richardson, TX (US)

(73) Assignee: Icera Canada ULC, Calgary (CA)

( * ) Notice: Subject to any disclaimer, the term of this patent is extended or adjusted under 35 U.S.C. 154(b) by 0 days.

(21) Appl. No.: 11/778,849

(22) Filed: Jul. 17, 2007

(65) Prior Publication Data
US 2009/0021321 A1   Jan. 22, 2009

(51) Int. Cl.
*H04L 27/20* (2006.01)
*H04L 27/36* (2006.01)

(52) U.S. Cl. .................. 332/103; 375/298; 375/308

(58) Field of Classification Search ......... 332/103–105, 332/144–145; 375/297, 298, 300, 302, 308
See application file for complete search history.

(56) References Cited

U.S. PATENT DOCUMENTS 7,126,999 B2 * 10/2006 Dent .................... 375/261

* cited by examiner

*Primary Examiner*—David Mis
(74) *Attorney, Agent, or Firm*—Borden Ladner Gervais LLP; Jeffrey W. Wong

(57) ABSTRACT

The invention is directed at a hybrid modulation apparatus which combines a polar modulation circuit and a linear modulation circuit. The hybrid apparatus allows a communications device to function as a polar or a linear modulation circuit with less components as the output of the linear modulation circuit is an input of the polar modulation circuit.

12 Claims, 5 Drawing Sheets

HYBRID LINEAR AND POLAR MODULATION APPARATUS

FIELD OF THE INVENTION

The present invention relates generally to modulation. More particularly, the present invention relates to a hybrid linear and polar modulation apparatus.

BACKGROUND OF THE INVENTION

The use of modulation in the field of telecommunications is well known. Modulation is used to vary an input signal, such as a periodic waveform, so that the waveform can then be used to transmit or convey a message. After receiving the input signal, the communication device modulates the input signal to produce a transmittable signal.

Typically, a communication device includes components to receive an analog or digital input signal and then modulates the signal either using linear or polar modulation. Linear modulation is also known as direct or Cartesian modulation. Most devices are capable of handling only one of the two modes of modulation and therefore certain devices are restricted to predetermined communication protocols.

Use of a solely linear modulation circuit in a communication device, such as the one shown in FIG. 1, is known in the art. The linear modulation circuit 10 includes a first input 12, denoted as I_data, and a second input 14, denoted as Q_data. The first input 12 is connected to a multiplier 16 which multiplies the input with the value (cos ωt) with ω representing the radio frequency at which the wireless communications is performed and t representing a specific moment in time.

The second input 14 is connected to a multiplier 18 and multiplied with the value (sin ωt). The products, or outputs, from the multipliers 16 and 18 are then added together via a summer 20 to produce the transmittable signal. The disadvantage of this type of circuitry is that if there is any amplification or gain after the summer 20, it has to be linear in order for the signal to be used by other device circuitry. This requires more power to be drawn for the overall linear modulation process. This is unwanted since there is a limited amount of power available within the device.

Use of a communication device having only polar modulation circuitry, such as that which is shown schematically in FIG. 2, also has its disadvantages. The polar modulation circuitry 30 comprises a pair of inputs 32 and 34 whereby the first input 32 is denoted by A(t) while the second input 34 is denoted as V(t). These values are related to the two inputs in FIG. 1, but in polar form whereby V(t) represents the phase information of θ(t), and A(t) is the amplitude information.

The second input 34 is passed through a summer 35 before being transmitted to a voltage controlled oscillator (VCO) 36, and then combined along with the first input 32 using an amplifier 38. The output of the amplifier 38 is then transmitted to an antenna which transmits the output to another communicating party.

An output of the VCO 36 is fed back to the summer 35 through a phase lock loop (PLL) 37 in order to control the phase difference between the two inputs 32 and 34 after the second input 34 passes the VCO 36. As is known, there is a delay which is introduced into the circuitry 30 while the VCO 36 is in operation and therefore it is difficult to time the arrival of the first 32 and second 34 inputs at the amplifier 38 since both are based on time. Therefore, the PLL 37 locks the phase at time equals 0. One disadvantage is that the bandwidth of the PLL 37 can be restricted by the bandwidth of V(t).

It is, therefore, desirable to provide a hybrid linear and polar modulation apparatus.

SUMMARY OF THE INVENTION

It is an object of the present invention to obviate or mitigate at least one disadvantage of previous modulation circuitry.

The present invention is directed at apparatus for providing linear and polar modulation using a hybrid circuitry. The invention allows for both linear and polar modulation to be operational in the same radio frequency path. The hybrid nature of the apparatus also reduces the number of components required in order to allow a mobile communication device to operate in either a linear or polar modulation mode, as selected by the carrier service.

This allows for the selection of which architecture is best for a selected modulation type. For instance, the mobile device can operate using polar modulation for 8PSK modulation as used in the EDGE and then subsequently operate using linear modulation for 16QAM modulation.

In a first aspect, the present invention provides a hybrid linear and polar modulation apparatus comprising: a linear modulation circuit; and a polar modulation circuit; whereby an input of the polar modulation circuit is an output of the linear modulation circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for a hybrid linear and polar modulation apparatus.

In transmission theory, there is a correlation between linear and polar coordinates. In linear coordinates, a linear signal is represented by I and Q values where:

$$\text{the linear signal} = I * \cos \omega t + Q * \sin \omega t$$

where ω represents the carrier frequency and t represents time

In polar coordinates, a polar signal is represented by R and θ values where:

$$\text{the polar signal} = R(t) * \sin(\omega t + \theta(t))$$
$$= R(t) * \cos\theta(t) * \sin\omega t + R(t) * \sin\theta(t) * \cos\omega t$$

where R equals the amplitude of the waveform signal and θ represents the angle in polar coordinates.

In relation to the linear signal, I=R(t)*sin θ(t) and Q=R(t)*cos θ(t)

Figure 3:
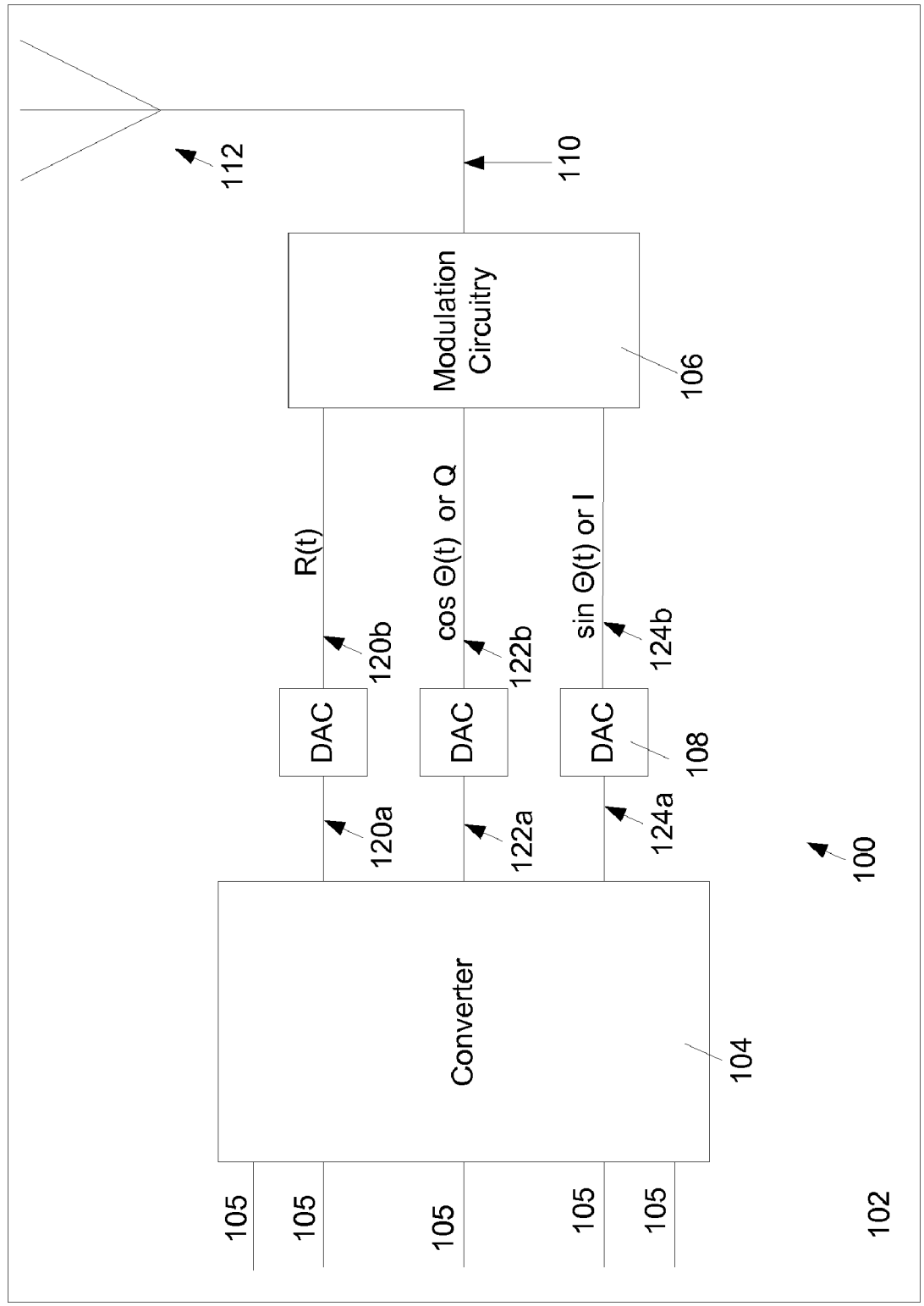
FIG. 3 is a schematic diagram of apparatus for performing modulation.

Turning to FIG. 3, a schematic diagram of apparatus for modulating signals in a telecommunications environment is shown. The apparatus 100 is typically located within a mobile communication device 102 and includes a converter 104 for receiving inputs 105 from other components in the mobile communication device 102. The inputs to the converter represent data which is to be transmitted. The converter 104 is preferably capable of converting IQ (linear) signals to Rθ (polar) signals and vice versa and has three outputs 120a, 122a and 124a which serve as inputs 120b, 122b and 124b to a hybrid modulation apparatus 106. An output 110 (the transmittable signal) of the hybrid modulation apparatus 106 is then transmitted to an antenna 112 which then transmits the signal to another communication party. Although not shown, other hardware, such as filters or switches, can be placed between the output 110 of the hybrid modulation circuitry 106 and the antenna 112. It will be understood by those of ordinary skill in the art that well-known methods, procedures and components have not been described in detail so as not to obscure the embodiments described herein.

When the inputs 105, or data in the form of linear or polar signals, is received by the converter 104, this data is then converted to either linear or "polar-like" values and then output to the hybrid modulation circuitry 106. The "polar-like" values are R(t), sin θ and cos θ and the linear values are I and Q where I=R(t)sin θ(t) & Q=R(t)cos θ(t).

If the converter 104 converts the data to linear values, one of the outputs 120a is not used or is a constant value with respect to time. When the mobile communication device 102 is in a linear modulation, or transmittal, mode and the inputs to the converter 104 are polar values (i.e. R(t), θ (t)), the other two outputs 122a and 124a of the converter 104 are Q & I, respectively.

If the mobile communication device 102 is in a polar modulation, or transmittal, mode and the inputs to the converter 104 are linear signals (i.e., I & Q), the outputs 120a, 122a and 124a of the converter 104 are R(t), cos θ(t) & sin θ(t).

In alternative embodiments, if the mobile communication device 102 is operating in linear modulation mode and the data input to the converter 104 is linear, there is no need to convert the data. Similarly if the mobile communication device 102 is operating in polar modulation mode and the data input to the converter 104 is polar, there is no need to convert the data.

If necessary, the outputs from the converter 104 are passed through a set of digital to analog converters (DACs) 108 before being input to the hybrid modulation circuitry 106. The DACs 108 are required if the outputs from the converter 104 are in a digital format in order to convert the digital signals to analog equivalents. As will be understood, the converter 104 preferably operates in the digital domain and therefore, the signals need to be converted to the analog domain prior to being modulated. If the converter 104 is operating in the analog domain, the outputs of the converter 104 can be transmitted directly to the hybrid modulation circuit 106 which also operates in the analog domain. In an alternative embodiment, the hybrid modulation circuit 106 can be implemented digitally whereby the DACs 108 are not required if the converter 104 is also operating in a digital domain.

Figure 4:
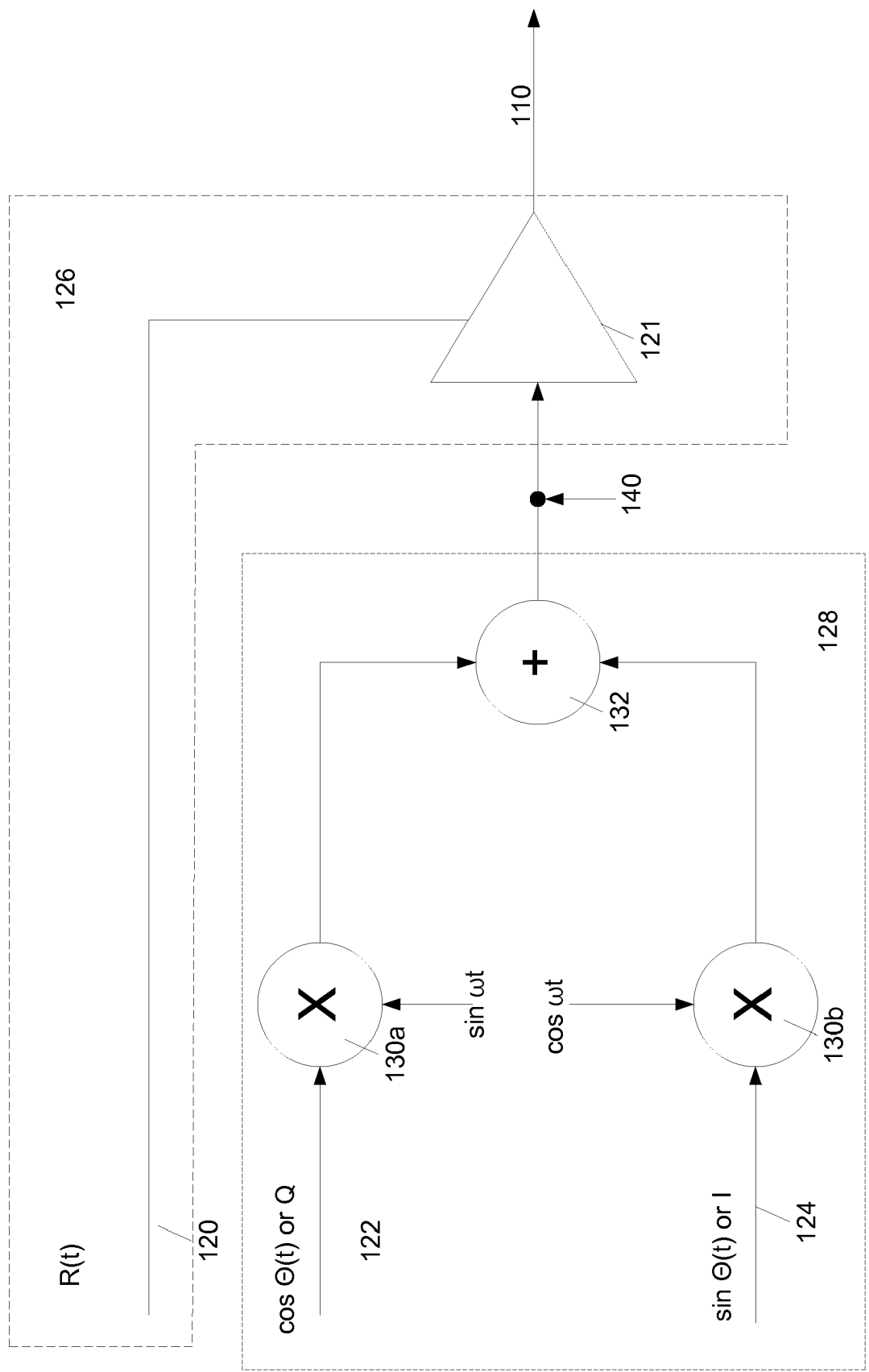
FIG. 4 is a schematic diagram of a hybrid linear and polar modulation apparatus.

Turning to FIG. 4, a schematic diagram of an embodiment of the hybrid linear and polar modulation apparatus, or circuitry, 106 is shown.

As shown, the circuitry 106 includes a first input 120b, a second input 122b and a third input 124b, corresponding to the outputs 120a, 122a and 124a of the converter 104.

In the linear modulation mode, the second input 122b is denoted as Q and the third input 124b is denoted as I. In the polar modulation mode, the first input 120b is denoted as R(t), the second input 122b is denoted as cos θ(t) and the third input 124b is denoted as sin θ(t).

The hybrid circuitry 106 includes a polar modulation circuit 126 and a linear modulation circuit 128 whereby an input of the polar modulation circuit 126 is an output of the linear modulation circuit 128. The polar modulation circuit 126 further includes an amplifier 121 and is connected to the input 120b.

The linear modulation circuit 128 is connected to the second input 122b and the third input 124b and comprises a pair of multipliers 130a and 130b and a summer 132. The second input 122b and the third input 124b are multiplied, using the multipliers 130a and 130b, by (sin ωt) and (cos ωt), respectively. As described above, ω represents the radio frequency at which the mobile communication device is operating and t is a specific moment in time.

The products are then added together via the summer 132 to produce an output 140. The output 140 is then transmitted to the amplifier 121 of the polar modulation circuit 126 where it is combined with the first input 120b to produce output 110 which is then transmitted to the antenna 112.

Figure 5:
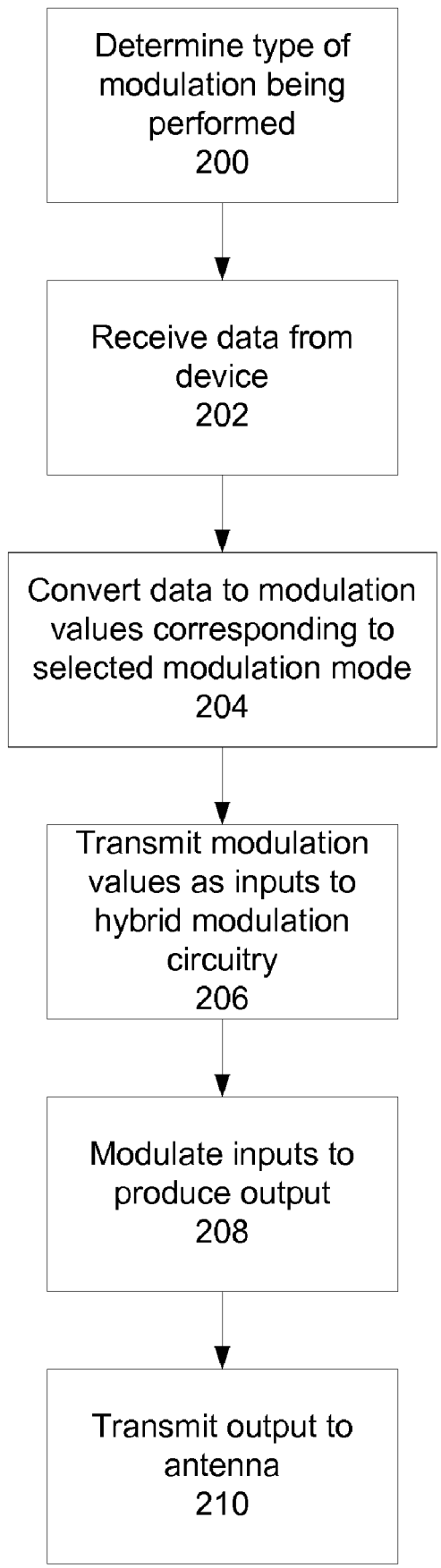
FIG. 5 is a flowchart outlining a method of modulation using a hybrid linear and polar modulation apparatus.

In operation, as shown in the flowchart of FIG. 5, an indicator signal is provided to the mobile communication device 102 to indicate whether the apparatus 100 is to operate in a linear or a polar modulation mode (step 200). After determining the mode, data, in the form of input signals 105, is received by the signal converter 104 (step 202) which then converts the data to either linear or polar values, in accordance with the modulation mode that been selected (step 204).

If the apparatus is operating in a linear modulation mode and the data is in linear form, the converter 104 passes the values through without conversion. Similarly, if the apparatus 100 is operating in a polar modulation mode and the data is in polar form, the converter 104 does not convert the data.

If the apparatus is operating in a linear modulation mode and the data is in polar form (R(t), θ(t)), the second 122a and third outputs 124a of the converter 104 are Q and I, where I=R(t)*sin θ(t) and Q=R(t)*cos θ(t). If the apparatus is operating in a polar modulation mode and the data is in linear form (I, Q), the outputs 120a, 122a and 124a of the converter 104 are R(t), sin θ(t) and cos θ(t).

As will be understood, by having two equations (I=R(t)*sin θ(t) and Q=R(t)*cos θ(t)) and two unknowns, the two unknowns can be easily determined, or calculated, through various calculation methods. A processor within the converter performs these calculations.

After the converter 104 converts the data, the outputs 120a, 122a and 124a are transmitted to the hybrid modulation circuitry 106 (step 206). In one embodiment, the inputs 120a, 122a and 124a are transmitted to the DACs 108 which convert the digital values to analog equivalents. These analog equivalents are then transmitted to the hybrid modulation circuitry 106 to serve as inputs 120b, 122b and 124b to the hybrid modulation circuitry 106. Alternatively, the outputs 120a, 122a and 124a can be directly transmitted to the circuitry 106.

The inputs 120b, 122b and 124b are then modulated by the hybrid modulation circuitry 106 in accordance with the selected modulation mode (step 208) by transmitting the second and third inputs 122b and 124b through the linear modulation circuit 128 and then combining the output 140 with the first input 120b via the polar modulation circuit 126.

In the linear modulation mode, the first input 120a is either not used or is a constant with respect to time so that its value does not affect the modulation circuitry 106 from operating in the linear mode. This also allows the output 140 to be passed through the amplifier 121 without being disturbed by the first input 120b to provide the output 110 which is then transmitted to the antenna 112. The second input 122b is supplied with the value of Q, while the third input 124b is supplied with the value of I.

In the polar modulation mode, the first input 120b is supplied with the value R(t), the second input 122b is supplied with the value cos θ(t) and the third input 124b is supplied with the value sin θ(t).

After the hybrid circuitry 106 receives the inputs 120b, 122b and 124b from the signal converter 104, or the DACs 108, the inputs are transmitted through the circuitry 106 to be modulated (step 208).

In the linear modulation mode, the second input 122b is multiplied with the value (sin ωt) via the multiplier 130a while the third input 124b is multiplied with the value (cos ωt) via the multiplier 130b. These values, I*cos ωt and Q*sin ωt, are then added together via the summer 132 and the sum represented by output 140. The output 140 of the summer 132 is then transmitted to the gain control 121 where it is multiplied to the first input 120b. As the first input 120b is either not used or a constant with respect to time, there is no effect on the output 140 of the summer 132 such that the hybrid modulation circuitry 106 acts as a linear modulation circuit. The output 110 of the gain control 121 is then transmitted to the antenna 112 (step 210).

In the polar modulation mode, the second input 122b is multiplied with the value (sin ωt) via the multiplier 130a while the third input 124b is multiplied with the value (cos ωt) via the multiplier 130b. These values, sin θ(t)*cos ωt and cos θ(t)*sin ωt, are then added together via the summer 132 and the sum represented by output 140. This output 140 provides a peak to average value of 0 which results in the signal having a constant envelope.

Figure 1:
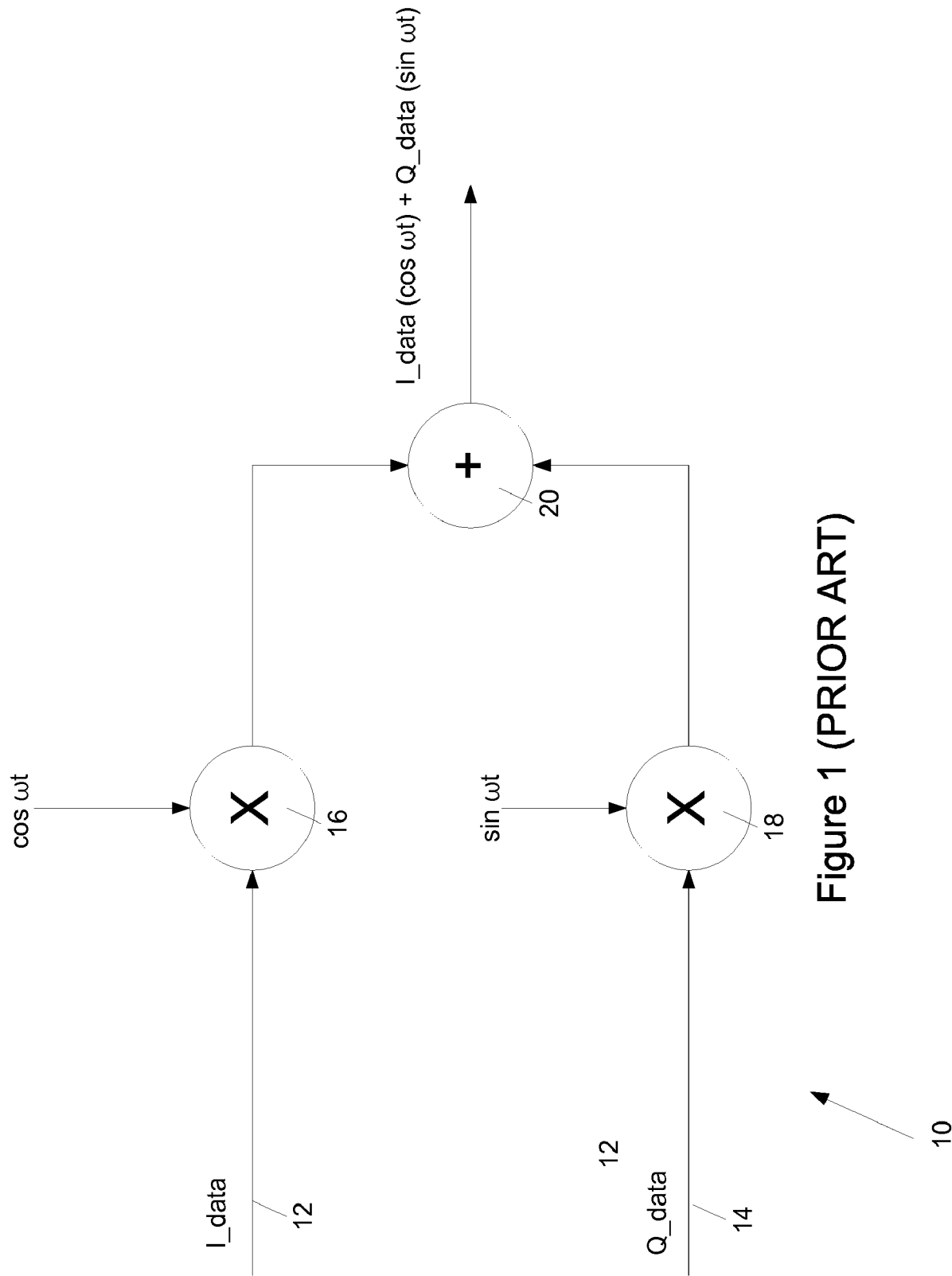
FIG. 1 is a schematic diagram of a prior art linear modulation circuit.
Figure 2:
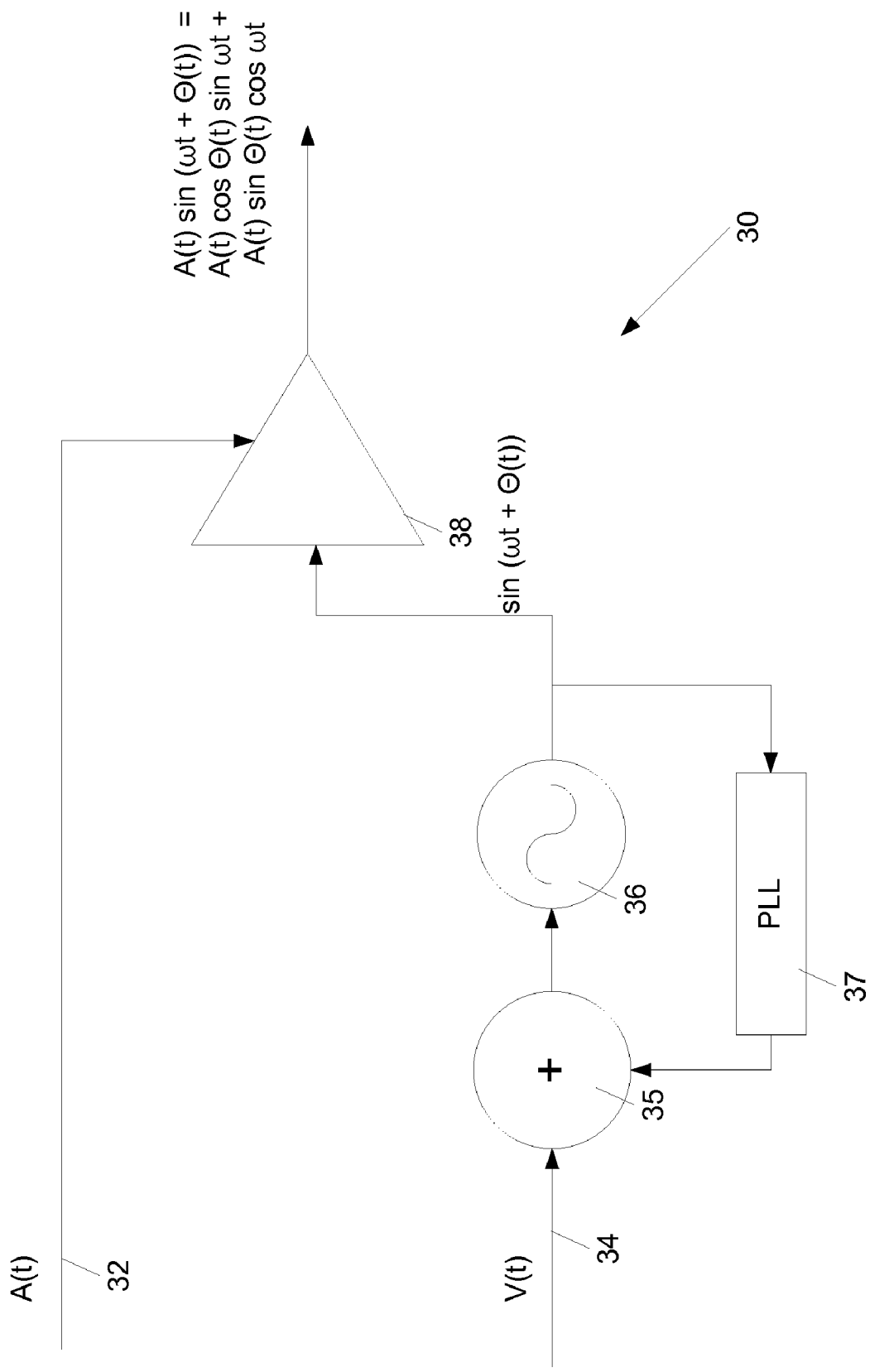
FIG. 2 is a schematic diagram of a prior art polar modulation circuit.

As will be understood, the output of cos θ(t)*sin ωt+sin θ(t)*cos ωt equals sin(ωt+θ) which is the output that is provided by the PLL and VCO combination of FIG. 2. However, the hybrid modulation circuitry 106 does not require a PLL & VCO combination to eliminate the phase between the inputs. Therefore, there is no trade off made between the bandwidth of the PLL and the bandwidth of the signals sin θ(t) & cos θ(t) which improves overall operation of the circuitry 106 and of the device 102.

The output 140 is then transmitted, as an input to the polar modulation circuit 126, through the gain block 121 along with the first input 120b to produce a gain block output 110 of R(t)sin θ(t)*cos ωt and R(t)cos θ(t)*sin ωt which is then transmitted to the antenna 112 (step 210).

As shown, the hybrid apparatus 106 can operate in either a linear or a polar modulation mode by using common parts and any device 102 incorporating the hybrid modulation circuitry 106 can operate in either modulation modes without the need for two separate sets of circuitry.

One advantage of the present invention is that, in the polar modulation mode, the hybrid modulation circuitry 106 decouples the performance of the phase lock loop from the performance of the transmitter thereby reducing the number of components required to operate in the polar modulation mode.

In a further embodiment, the circuitry can include an oversampled DAC to avoid quantization errors.

The hybrid circuitry 106 provides an apparatus which reduces, or eliminates, the disadvantages of individual linear or polar modulation circuitry. The provision of the converter 104 which is capable of providing the inputs 120b, 122b and 124b for the hybrid modulation circuitry 106 allows the same circuitry to be used for either polar or linear signals. This also reduces the number of overall components required as the same circuitry can be used for either polar or linear signals.

Yet another advantage of the invention over is that the signal at the output 140 has a peak to average value of 0 dB in either modulation mode. For this reason, the gain block 121 does not need to be a linear amplifier; since a linear amplifier requires more power to operate than a typical gain block or amplifier.

In the above description, for purposes of explanation, numerous details have been set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A hybrid linear and polar modulation apparatus comprising:
   a linear modulation circuit; and
   a polar modulation circuit including only an amplifier for receiving a digital polar modulation input and the linear modulation output;
   whereby an input of the polar modulation circuit is an output of the linear modulation circuit.

2. The hybrid linear and polar modulation apparatus of claim 1 wherein the linear modulation circuit comprises:
   a first multiplier for multiplying a first input with a predetermined first value to produce a first product;

a second multiplier for multiplying a second input with a predetermined second value to produce a second product; and a summer for adding the first product to the second product to produce the linear modulation output.

3. The hybrid linear and polar modulation apparatus of claim 2 wherein the polar modulation circuit comprises:

an amplifier for receiving a polar modulation input and the linear modulation output.

4. The hybrid linear and polar modulation apparatus of claim 1 further comprising:

a signal converter, connected to inputs of the linear modulation circuit and the polar modulation circuit, for converting data to linear or polar values.

5. The hybrid linear and polar modulation apparatus of claim 4 further comprising:

a set of digital to analog converters located between the signal converter and the inputs.

6. The hybrid linear and polar modulation apparatus of claim 1 wherein an output of the polar modulation circuit is to an antenna for transmitting the output.

7. The hybrid linear and polar modulation apparatus of claim 4 wherein the signal converter converts the data to polar equivalents.

8. The hybrid linear and polar modulation apparatus of claim 4 wherein the signal converter converts the data to linear equivalents.

9. The hybrid linear and polar modulation apparatus of claim 7 wherein the polar equivalents are $R(t)$, $\sin \theta(t)$ and $\cos \theta(t)$.

10. The hybrid linear and polar modulation apparatus of claim 1 wherein the polar modulation input is $R(t)$.

11. The hybrid linear and polar modulation apparatus of claim 2 wherein:

the first input is $\sin \theta(t)$ and the first predetermined value is $\cos \omega t$.

12. The hybrid linear and polar modulation apparatus of claim 2 wherein:

the second input is $\cos \theta(t)$ and the second predetermined value is $\sin \omega t$.

* * * * *